United States Patent
Su et al.

(10) Patent No.: US 9,236,733 B2
(45) Date of Patent: Jan. 12, 2016

(54) ELECTROSTATIC DISCHARGE PROTECTION

(71) Applicant: TAIWAN SEMICONDUCTOR MANUFACTURING COMPANY, LTD., Taiwan (CN)

(72) Inventors: Yu-Ti Su, Taiwan (CN); Wun-Jie Lin, Taiwan (CN); Tsung-Che Tsai, Taiwan (CN); Jen-Chou Tseng, Taiwan (CN)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 13/952,417

(22) Filed: Jul. 26, 2013

(65) Prior Publication Data

US 2015/0029622 A1    Jan. 29, 2015

(51) Int. Cl.
*H02H 9/04* (2006.01)
*H01L 29/74* (2006.01)
*H01L 27/02* (2006.01)

(52) U.S. Cl.
CPC ........... *H02H 9/046* (2013.01); *H01L 27/0262* (2013.01); *H01L 29/7436* (2013.01)

(58) Field of Classification Search
CPC  H01L 27/0262; H01L 29/7436; H02H 9/046; H02H 9/04
USPC .......................................................... 361/56
See application file for complete search history.

(56) References Cited

U.S. PATENT DOCUMENTS

| | | | |
|---|---|---|---|
| 4,896,243 A | 1/1990 | Chatterjee et al. | |
| 4,939,616 A | 7/1990 | Rountree | |
| 5,465,189 A | 11/1995 | Polgreen et al. | |
| 5,754,380 A * | 5/1998 | Ker et al. | 361/56 |
| 6,016,002 A * | 1/2000 | Chen et al. | 257/546 |
| 6,580,184 B2 * | 6/2003 | Song | 307/112 |
| 6,737,682 B1 * | 5/2004 | Yu | 257/173 |
| 7,542,253 B2 | 6/2009 | Ker et al. | |
| 8,310,027 B2 * | 11/2012 | Russ et al. | 257/575 |
| 2002/0154463 A1 * | 10/2002 | Mergens et al. | 361/56 |
| 2004/0201033 A1 * | 10/2004 | Russ et al. | 257/107 |

OTHER PUBLICATIONS

Ming-Dou Ker, et al., Low-Capacitance SCR with Waffle Layout Structure for On-Chip ESD Protection in RFICs (IEEE Transactions on Microwave Theory and Techniques, vol. 56, No. 5, May 2008.

* cited by examiner

*Primary Examiner* — Scott Bauer (74) *Attorney, Agent, or Firm* — McDermott Will & Emery LLP (57) ABSTRACT

A semiconductor device is disclosed that includes a first well of a first conductivity type, a second well of a second conductivity type, a plurality of first regions, a second region and a plurality of electrodes. The first regions are of the first conductivity type and are formed in the second well. The second region is of the second conductivity type and is formed in the first well. Each of the electrodes is formed upon the second well and between adjacent two first regions of the first regions.

18 Claims, 8 Drawing Sheets

FIG. 8

ELECTROSTATIC DISCHARGE PROTECTION

FIELD

The present disclosure relates to electrostatic discharge (ESD) protection of integrated circuits.

BACKGROUND

Electrostatic discharge (ESD) protection is provided to protect circuitry of semiconductor devices in the presence of an ESD event. The ESD event causes a voltage stress to the semiconductor device. The voltage stress is usually in the kilo-volts range.

If the voltage stress is not prevented, the voltage stress could cause damages such as breakdown, metal electromigration, gate oxide rupture, etc., to the semiconductor device.

BRIEF DESCRIPTION OF THE DRAWINGS

The disclosure can be more fully understood by reading the following detailed description of various embodiments, with reference to the accompanying drawings as follows.

DETAILED DESCRIPTION

In the following description, specific details are presented to provide a thorough understanding of the embodiments of the present disclosure. Persons of ordinary skill in the art will recognize, however that the present disclosure can be practiced without one or more of the specific details, or in combination with other components. Well-known implementations or operations are not shown or described in detail to avoid obscuring aspects of various embodiments of the present disclosure.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

It will be understood that, although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

As used herein, the terms "comprising," "including," "having," "containing," "involving," and the like are to be understood to be open-ended, i.e., to mean including but not limited to.

Reference throughout the specification to "one embodiment" or "an embodiment" means that a particular feature, structure, implementation, or characteristic described in connection with the embodiment is included in at least one embodiment of the present disclosure. Thus, uses of the phrases "in one embodiment" or "in an embodiment" in various places throughout the specification are not necessarily all referring to the same embodiment.

Furthermore, the particular features, structures, implementation, or characteristics may be combined in any suitable manner in one or more embodiments.

Figure 1:
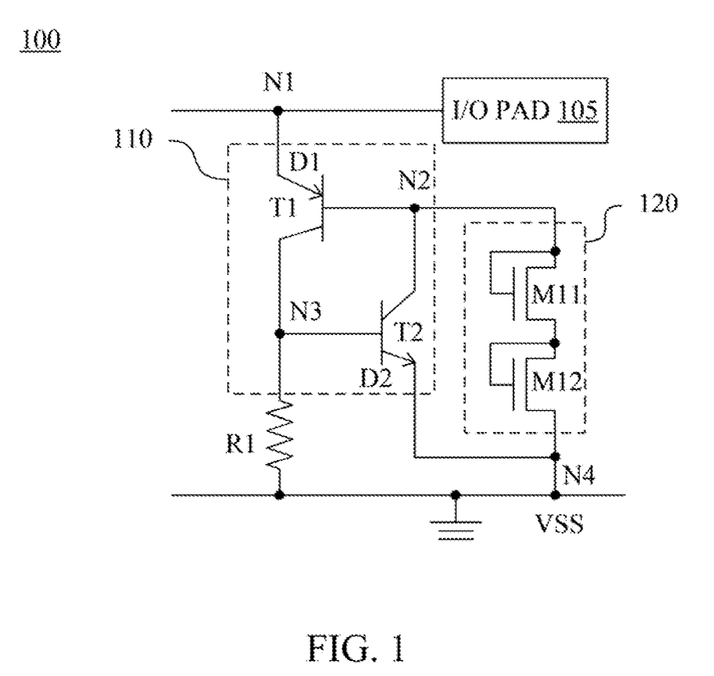
FIG. 1 is a schematic diagram of an ESD protection circuit in accordance with some embodiments of the present disclosure.

FIG. 1 is a schematic diagram of an ESD protection circuit 100 in accordance with some embodiments of the present disclosure. For Illustration, a silicon controlled rectifier (SCR) 110 and a MOS circuit 120 are provided in the ESD protection circuit 100.

The I/O pad 105 is configured to transmit an operation voltage to or receive an operation voltage from circuitry (not labeled) in an operation state of the circuitry. The operation voltage is supplied to a system (not labeled) in which the ESD protection circuit 100 is disposed, for the system to function accordingly. When an ESD event occurs, a corresponding voltage surge is transmitted to the I/O pad 105. The ESD protection circuit 100 provides a protection mechanism explained below to discharge the voltage surge at the I/O pad 105.

In some embodiments, the operation voltage received by the I/O pad 105 has a value such as 1.8 V, 3.3 V or 5 V, depending on the technology node, and the reference voltage at the voltage terminal VSS is a ground voltage. The values of the operation voltage and the reference voltage are given for illustrative purposes. Other values of the operation voltage and the reference voltage are within the contemplated scope of the present disclosure.

The SCR 110 includes a PNP bipolar junction transistor (BJT) T1 and an NPN bipolar junction transistor T2. The emitter, base, and collector of the PNP BJT T1 are connected to the nodes N1, N2 and N3, respectively. The collector, base, and emitter of the NPN BJT T2 are connected to the nodes N2, N3 and N4, respectively. The node N1 is connected to an input/output (I/O) pad 105. The node N4 is connected to a voltage terminal VSS receiving a reference voltage. For the illustration in FIG. 1, a resistance R1 is presented between the node N3 and the node N4 to indicate the parasitic effect of the semiconductor structure of the ESD protection circuit 100.

The PNP BJT T1 includes a P type region at the node N1 and an N type region at the node N2, which form a PN junction and operate as a first diode D1. Similarly, the NPN BJT T2 includes a P type region at the node N3 and an N type region at the node N4, which form another PN junction and operate as a second diode D2.

The MOS circuit 120 is connected between the nodes N2 and N4. Because the nodes N2 and N4 are in the N type regions of the diode D1 and the diode D2, the MOS transistors M11 and M12 are effectively in between the N type regions of the diode D1 and the diode D2. The MOS circuit 120 includes two MOS transistors M11 and M12 that are cascade-connected. Each of the MOS transistors M11 and M12 is an NMOS transistor.

As used in the present disclosure, the term "cascade" refers to a of transistors that are connected in a way such that the current from a transistor flows toward a following transistor. For illustration in FIG. 1, the source of the MOS transistor M11 is connected to the drain of the MOS transistor M12, such that the current flows through the MOS transistors M11 and M12.

The gate and the drain of each of the MOS transistors M11 and M12 are connected together. Therefore, the MOS transistors M11 and M12 turn on quickly when a voltage higher than a corresponding threshold voltage Vth of each of the MOS transistors M11 and M12 is presented at the drain of the corresponding MOS transistor M11 or M12.

In some embodiments, the threshold voltage Vth of each of the MOS transistors M11 and M12 is 0.7 V. Therefore, it takes 1.4 V at the node N2 to conduct the MOS transistors M11 and M12. Other values of the threshold voltage of the MOS transistors M11 and M12 are within the contemplated scope of the present disclosure.

Figure 2:
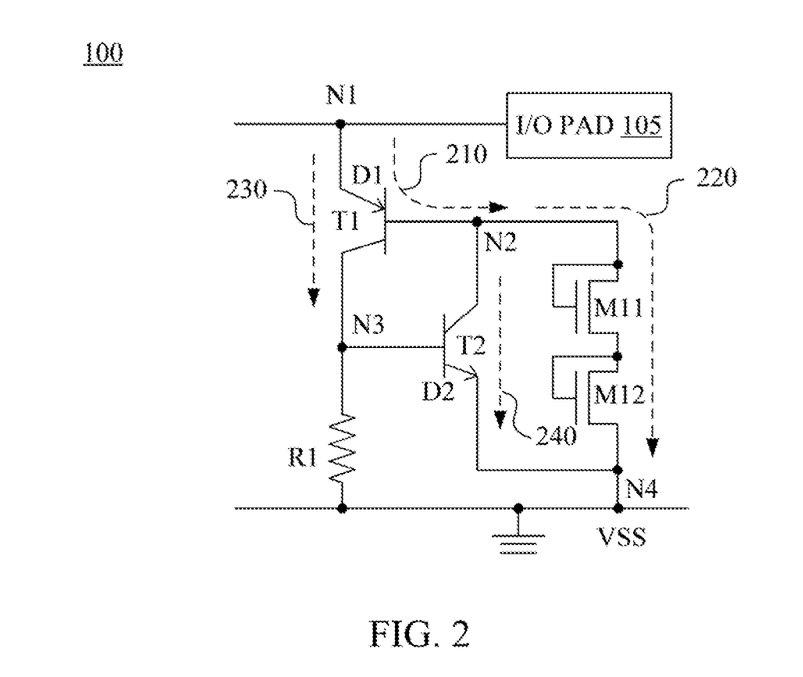
FIG. 2 is a schematic diagram of the ESD protection circuit used to illustrate operations of the ESD protection circuit in FIG. 1, in accordance with some embodiments of the present disclosure.
Figure 3:
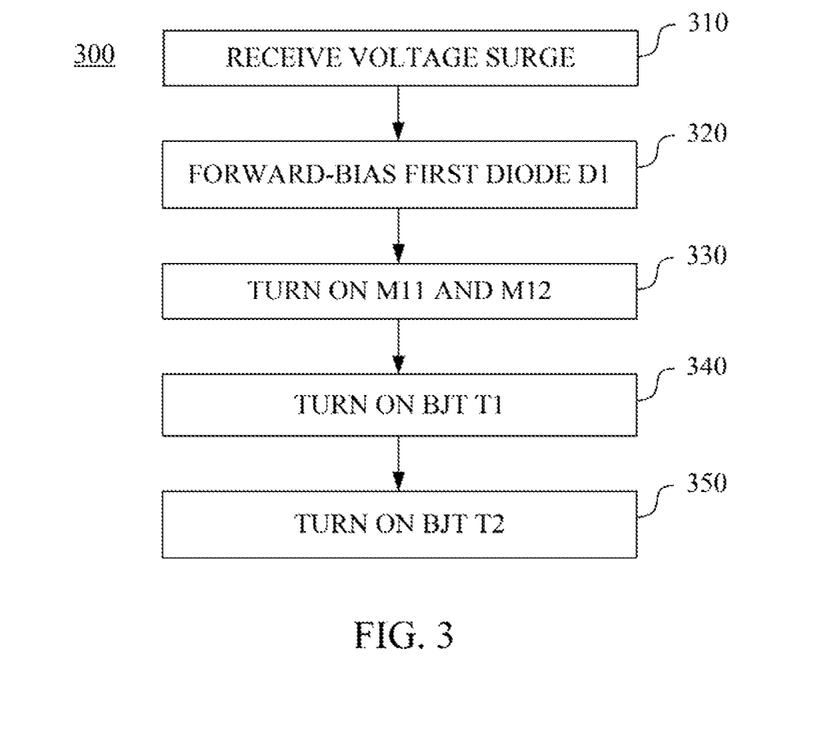
FIG. 3 is a flow chart of a method illustrating ESD protection in the ESD protection circuit in FIG. 1, in accordance with some embodiments of the present disclosure.

FIG. 2 is a schematic diagram illustrating exemplary operations of the ESD protection circuit 100 in accordance with some embodiments of the present disclosure. FIG. 3 is a flow chart of a method 300 illustrating ESD protection based on the ESD protection circuit 100, in accordance with some embodiments of the present disclosure. The method 300 is described below with the exemplary operations of the ESD protection circuit 100 illustrated in FIG. 2.

In operation 310, a voltage surge corresponding to an ESD event is received at the I/O pad 105. For illustration, the voltage surge is in excess of the kilo-volts range. Other values of the voltage surge are within the contemplated scope of the present disclosure.

In operation 320, the diode D1 is forward-biased by the voltage surge. As a result, the voltage surge is transmitted from the node N1 to the node N2 on a path 210.

In operation 330, the voltage surge is transmitted from the node N2 to the node N4 on a path 220. As a result, the MOS transistors M11 and M12 are sequentially turned on in accordance with the voltage surge. Consequently, the node N2 is electrically pulled to the voltage VSS or the ground voltage at the source of the MOS transistor M12.

In operation 340, the PNP BJT T1 is turned on when the voltage difference between the nodes N1 and N2 is larger than the threshold voltage of the PNP BJT T1. Therefore, the ESD current caused by the ESD event flows through the PNP BJT T1 and the resistance R1 on a path 230. As a result, the voltage at the node N3 is generated.

In operation 350, the PNP BJT T2 is, then turned on by the voltage at the node N3, and the ESD current further flows through the PNP BJT T2 on a path 240 to ground.

As illustratively shown in operations 340 and 350, the PNP BJT T1 and the PNP BJT T2 are turned on, and the SCR 110 in FIG. 1 is triggered. Further, the ESD current is directed to ground, and therefore does not flow through other circuitry (not shown). Effectively, the ESD protection circuit 100 provides the ESD protection for the other circuitry.

Based on the aforementioned operations of the MOS circuit 120 that includes the transistors M11 and M12, the MOS circuit 120 quickly causes a current path to turn on the PNP BJT T1 according to the voltage surge. The turn-on of the PNP BJT T1, in turn, turns on the NPN BJT T2. The SCR 110 is thus triggered. Therefore, the MOS circuit 120 assists in triggering the SCR 110 to quickly discharge the voltage surge. As a result, the damages caused by the ESD event can be prevented.

In some embodiments, the gate of the MOS transistor M11 or M12 is not connected to the corresponding drain. Instead, the gate of the MOS transistor M11 or M12 is floating or connected to the ground voltage. The MOS transistors M11 and M12 having their gate either floating or grounded have operations similar to those illustrated in FIG. 2.

The MOS circuit 120 also functions when the gate of the MOS transistor M11 is either floating or is connected to its drain or the ground voltage, and the gate of the MOS transistor M12 is either floating or is connected to its drain or the ground voltage.

Two MOS transistors in the MOS circuit 120 in FIG. 1 are for illustrative purposes. A different number of the MOS transistors in the MOS circuit 120 is within the contemplated scope of the present disclosure. In such a condition, the gate of any one of the MOS transistors is either floating or is connected to its drain or the ground voltage.

Figure 4:
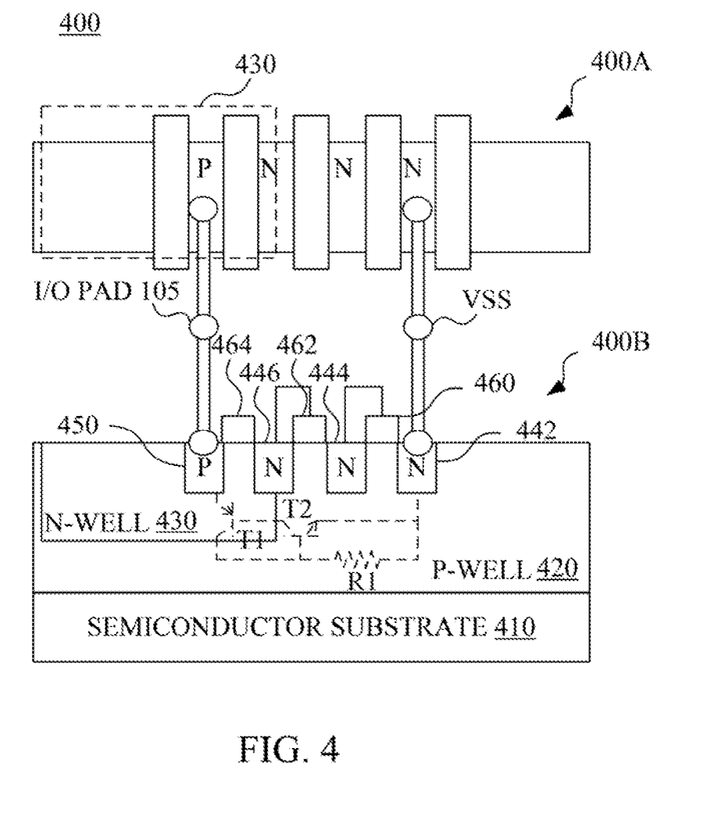
FIG. 4 is a schematic diagram illustrating a top view and a cross-sectional view of a semiconductor structure of the ESD protection circuit in FIG. 1, in accordance with some embodiments of the present disclosure.

FIG. 4 is a schematic diagram illustrating a top view 400A and a cross-sectional view 400B of a semiconductor structure 400 in accordance with some embodiments of the present disclosure. The semiconductor structure 400 is an exemplary semiconductor structure of the ESD protection circuit 100 in FIG. 1.

In the cross-sectional view 400B, the P-well 420 corresponds to the node N3 in FIG. 1, and is formed in the semiconductor substrate 410. The N-well 430 corresponds to the node N2, and is formed in the P-well 420. The P-type region 450 corresponds to the node N1, and is formed in the N-well 430. The N-type regions 442 and 444 are formed in the P-well 420. The N-type region 446 is formed across the N-well 430 and the P-well 420.

The electrode 460 is formed upon the P-well 420 and between the N-type regions 442 and 444. The electrode 462 is formed upon the P-well 420 and between the N-type regions 444 and 446. The electrode 464 is formed upon the N-well 410.

For illustration in FIG. 4, the N-type regions 442, 444, 446 and the P-type region 450 are formed with a planar-type structure. In alternative embodiments, the N-type regions 442, 444, 446 and the P-type region 450 are formed with a fin-type structure.

The P-type region 450, the N-well 430, the P-well 420 and the N-type region 442 together form a structure operating as the SCR 110 in FIG. 1. Specifically, the P-type region 450, the N-well 430, and the P-well 420 together form the PNP BJT T1. Similarly, the N-well 430, the P-well 420 and the N-type region 442 together form the NPN BJT T2. The parasitic resistance in the P-well 620 forms the resistance R1 in FIG. 1.

The N-type regions 446 and 444 form the drain and source of the MOS transistor M11, respectively, and the electrode 462 forms the gate of the MOS transistor M11. The N-type regions 444 and 442 form the drain and source of the MOS transistor M12, respectively, and the electrode 460 forms the gate of the MOS transistor M12.

In some embodiments, the electrode 462 is connected to the N-type region 446, and the electrode 460 is connected to the N-type region 444. The connections of the electrodes 462 and 460 with the corresponding N-type regions 446 and 444 depicted in FIG. 4 are similar to the connections of the gates with the drains of the MOS transistors M11 and M12 depicted in FIG. 1.

In some other embodiments, the electrode 462 that forms the gate of the MOS transistor M11 is not connected to the N-type region 446 that forms the drain of the MOS transistor M11 but is instead connected to the ground voltage. Similarly, the electrode 460 that forms the gate of the MOS transistor M12 is not connected to the N-type region 444 that forms the drain of the MOS transistor M12, but is instead connected to the ground voltage. In further embodiments, the electrode 462 that forms the gate of the MOS transistor M11 is not connected to the N-type region 446 that forms the drain of the MOS transistor M11, but is instead floating. Similarly, the electrode 460 that forms the gate of the MOS transistor M12 is not connected to the N-type region 444 that forms the drain of the MOS transistor M12, but is instead floating.

The number of the N-type regions together with the electrodes in FIG. 4 is for illustrative purposes. Other numbers of the N-type regions together with the electrodes in FIG. 4, which form the MOS transistors in FIG. 1, are within the contemplated scope of the present disclosure.

Based on the illustrations with reference to FIG. 4, the semiconductor structure 400 is simple compared with other approaches, and thus results in a simple layout and a smaller layout area compared with other approaches. Therefore, the metal routing is simplified according to the simple layout. Moreover, the SCR 110 in FIG. 1 is provided, and therefore, the characteristics of the SCR 110, such as the parasitic capacitance, the turn-on resistance and the voltage drop of the elements in the ESD protection circuit 110, can be improved.

Figure 5:
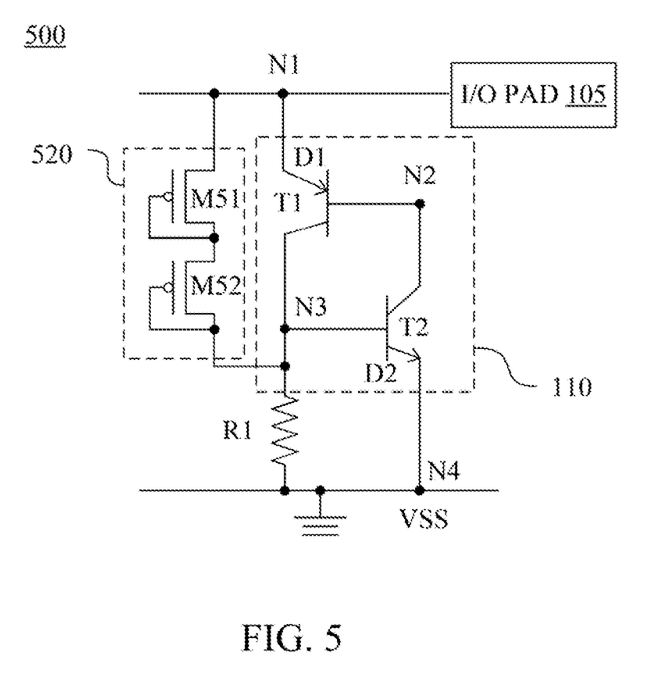
FIG. 5 is a schematic diagram of an ESD protection circuit in accordance with some other embodiments of the present disclosure.

FIG. 5 is a schematic diagram of an ESD protection circuit 500 in accordance with some other embodiments of the present disclosure.

Compared with the ESD protection circuit 100 in FIG. 1, the ESD protection circuit 500 does not include the MOS circuit 120, but includes a MOS circuit 520. The MOS circuit 520 is connected between the nodes N1 and N3. The MOS circuit 520 includes two MOS transistors M51 and M52 that are cascade-connected. Each of the MOS transistors M51 and M52 is a PMOS transistor.

As described above, the configuration of the PNP BUT T1 between the nodes N1 and N2 operate as the diode D1, and the configuration of the NPN BJT T2 between the nodes N3 and N4 operate as the diode D2. Therefore, the MOS transistors M51 and M52 are cascade-connected between the P type regions of the diode D1 and the diode D2.

In some embodiments, the gate and the drain of each of the MOS transistors M51 and M52 are connected together.

Figure 6:
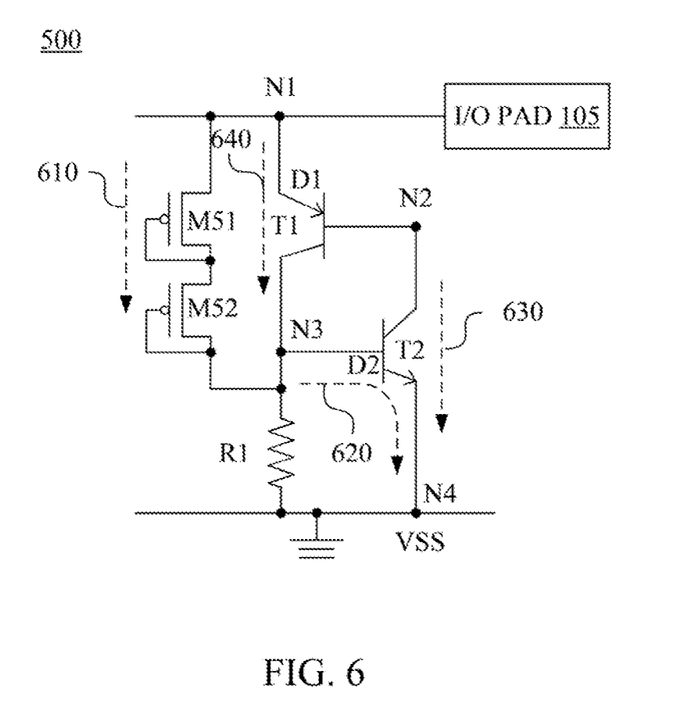
FIG. 6 is a schematic diagram of the ESD protection circuit used to illustrate operations of the ESD protection circuit in FIG. 5, in accordance with some embodiments of the present disclosure.
Figure 7:
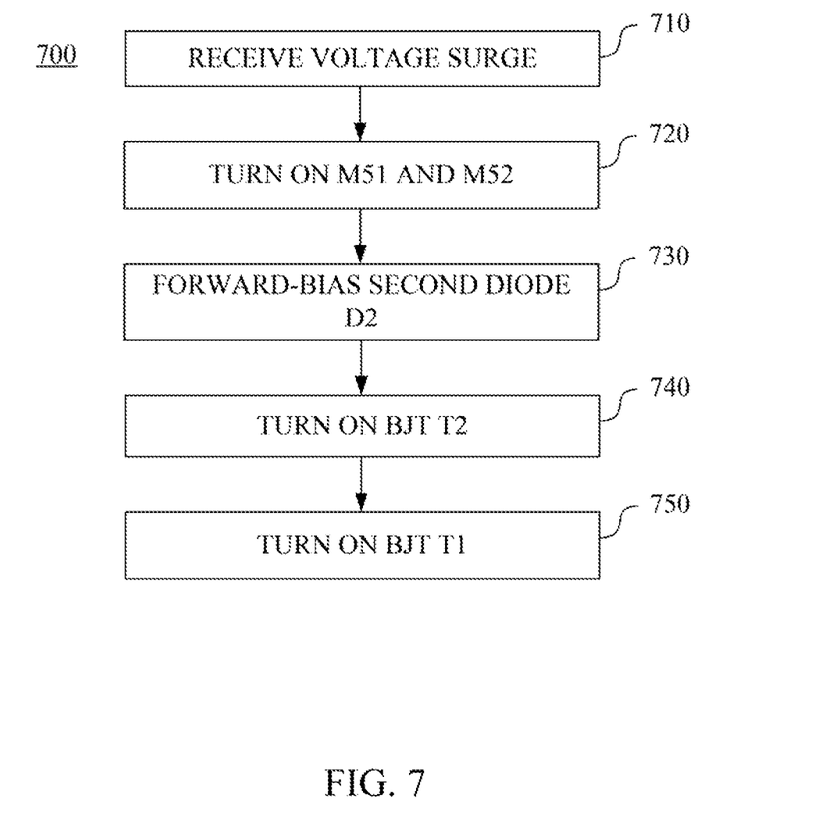
FIG. 7 is a flow chart of a method illustrating ESD protection in the ESD protection circuit 500 in accordance with some embodiments of the present disclosure.

FIG. 6 is a schematic diagram of the ESD protection circuit 500 used to illustrate operations of the ESD protection circuit 500 in accordance with some embodiments of the present disclosure. FIG. 7 is a flow chart of a method 700 illustrating ESD protection in the ESD protection circuit 500 in accordance with some embodiments of the present disclosure. The method 700 is described below with the exemplary operations of the ESD protection circuit 500 illustrated in FIG. 6.

In operation 710, a voltage surge corresponding to an ESD event is received at the I/O pad 105.

In operation 720, the MOS transistors M51 and M52 are sequentially turned on in accordance with the voltage surge, causing the node N1 to be connected to the node N3. As a result, the voltage surge is transmitted from the node N1 to the node N3 on a path 610.

In operation 730, the diode D2 is forward-biased by the voltage surge at the node N3, and causes a conduct path 620 when the voltage surge is transmitted to the node N3.

In operation 740, the NPN BJT T2 is turned on, and causes a conduct path 630. Therefore, the node N2 is connected to the voltage terminal VSS, and receives the ground voltage.

In operation 750, the PNP BJT T1 is turned on by the ground voltage received at the node N2. Therefore, the ESD current corresponding to the ESD event flows through the PNP BJT T1 on a path 640 and through the NPN BJT T2 on a path 630. Alternatively stated, the PNP BJT T1 and the NPN BJT T2 are both turned on, and cause the ESD current to be directed to ground. As a result, the ESD current does not flow to other circuits, and, the ESD protection circuit 500 effectively provides the ESD protection for the other circuits.

Based on the operations of the MOS circuit 520, the MOS circuit 520 quickly causes a current path to turn on the NPN BJT T2 according to the voltage surge. The turn-on of the NPN BJT T2 further turns on the PNP BJT T1. The SCR 110 is thus triggered. Therefore, the MOS circuit 520 assists in triggering the SCR 110 to quickly discharge the voltage surge as well. As a result, the damages caused by the ESD event can be prevented.

In some embodiments, the gate of the MOS transistor M51 or M52 is not connected to the drain thereof. Instead, the gate of the MOS transistor M51 or M52 is floating or is connected to the ground voltage. The MOS transistors M51 and M52 having their gate either floating or grounded have operations similar to those illustrated in FIG. 6. Therefore, the MOS circuit 520 in FIG. 5 also functions when any one of the MOS transistor M51 and M52 is either floating or connected to the ground voltage.

Similar to the embodiment in FIG. 1, the number of the MOS transistors in the MOS circuit 520 in FIG. 5 is for illustrative purposes. Other numbers of the MOS transistors in the MOS circuit 520 working in conjunction with the method 700 are within the contemplated scope of the present disclosure.

Figure 8:
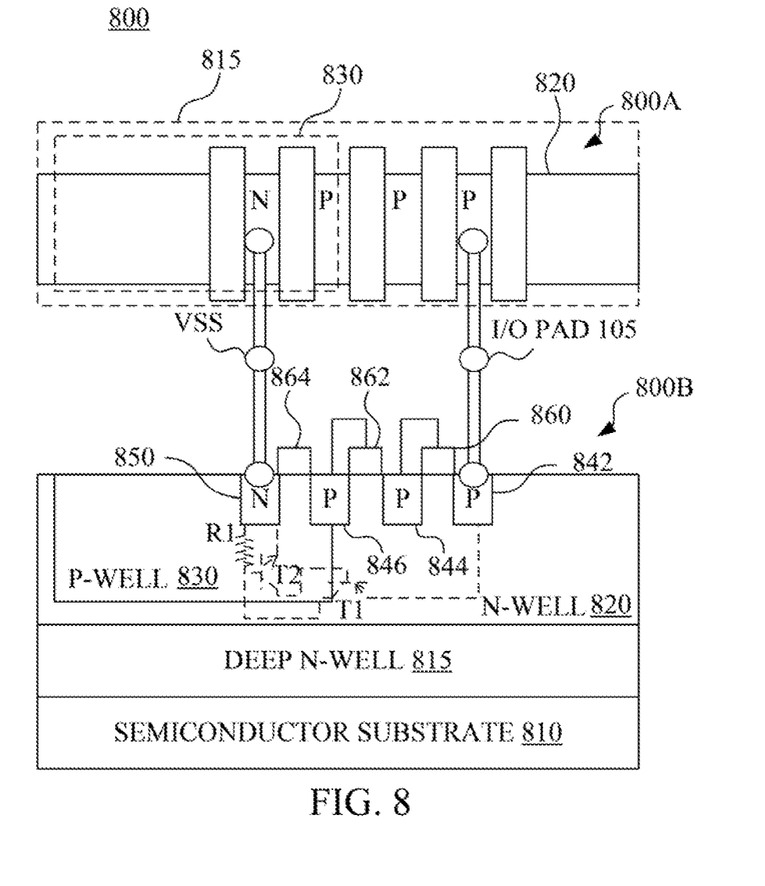
FIG. 8 is a schematic diagram illustrating a top view and a cross-sectional view of a semiconductor structure of the ESD protection circuit in FIG. 5, in accordance with some embodiments of the present disclosure.

FIG. 8 is a schematic diagram illustrating a top view 800A and a cross-sectional view 800B of a semiconductor structure 800 in accordance with some embodiments of the present disclosure. The semiconductor structure 800 is an exemplary semiconductor structure of the ESD protection circuit 500 in FIG. 5.

In the cross-sectional view 800A, a deep N-well 815 is formed on the semiconductor substrate 810. The N-well 820 corresponds to the node N2 in FIG. 5, and is formed in the deep N-well 815. The P-well 830 corresponds to the node N3 in FIG. 5, and is formed in the N-well 820. The N-type region 850 corresponds to the node N4 in FIG. 5, is formed in the P-well 830, and is connected to the voltage terminal VSS. The P-type regions 842 and 844 are formed in the N-well 820. The P-type region 842 is connected to the I/O pad 105. The P-type region 846 is formed across the P-well 830 and the N-well 820.

The electrode 860 is formed upon the N-well 820 and between the N-type regions 842 and 844. The electrode 862 is formed upon the N-well 820 and between the N-type regions 844 and 846. The electrodes 864 are formed upon the P-well 830.

For illustration in FIG. 8, the P-type regions 842, 844, 846 and the N-type region 850 are formed with a planar-type structure. In alternative embodiments, the P-type regions 842, 844, 846 and the N-type region 850 are formed with a fin-type structure.

The P-type region 842, the N-well 820, the P-well 830 and the N-type region 850 together form a structure operating as the SCR 110 in FIG. 5. Specifically, the P-type region 842, the N-well 820, and the P-well 830 together form the PNP BJT T1. Similarly, the N-well 820, the P-well 830, and the N-type region 850 together form the NPN BJT T2. The parasitic resistance in the P-well 830 forms the resistance R1 in FIG. 5.

The P-type regions 842 and 844 form the source and drain of the MOS transistor M51, respectively, and the electrode 860 forms the gate of the MOS transistor M51. The P-type regions 844 and 846 form the source and drain of the MOS transistor M52, respectively, and the electrode 862 forms the gate of the MOS transistor M52.

In some embodiments, the electrode 860 is connected to the P-type region 844, and the electrode 862 is connected to the P-type region 846. The connections of the electrodes 860 and 862 with the corresponding P-type regions 844 and 846 in FIG. 8 are similar to the connections of the gates with the drains of the MOS transistors M51 and M52 in FIG. 5.

In some other embodiments, the electrode 860 that forms the gate of the MOS transistor M51 is not connected to the P-type region 844 that forms the drain of the MOS transistor M51, but is instead connected to the ground. Similarly, the electrode 862 that forms the gate of the MOS transistor M52 is not connected to the P-type region 846 that forms the drain of the MOS transistor M52, but is instead connected to the ground. In further embodiments, the electrode 860 that forms the gate of the MOS transistor M51 is not connected to the P-type region 844, but is instead floating. Similarly the electrode 862 that forms the drain of the MOS transistor M52 is not connected to the P-type region 846, but is instead floating.

The number of the P-type regions together with the electrodes in FIG. 8 is for illustrative purposes. Other numbers of the P-type regions together with the electrodes in FIG. 8, which form the MOS transistors in FIG. 5, are within the contemplated scope of the present disclosure.

In FIG. 4 and FIG. 8, the MOS circuit for triggering the SCR includes either the cascade-connected NMOS transistors or the cascade-connected PMOS transistors. A combination of the cascade-connected NMOS transistors and the cascade-connected PMOS transistors is within the contemplated scope of the present disclosure. In other words, one or a combination of the MOS circuit 120 in FIG. 1 or the MOS circuit 520 in FIG. 5 assists in triggering the SCR to perform ESD protection. As a result, the damages caused by the ESD event can be prevented.

In this document, the term "connected" may be termed as "electrically connected", and the term "coupled" may be termed as "electrically coupled". "Connected" and "coupled" may also be used to indicate that two or more elements cooperate or interact with each other.

In some embodiments, a semiconductor device is disclosed that includes a first well, a second well, a plurality of first regions, a second region and a plurality of electrodes. The first well is of a first conductivity type and the second well is of a second conductivity type. The first regions are of the first conductivity type and are formed in the second well. The second region is of the second conductivity type and is formed in the first well. Each of the electrodes is formed upon the second well and between adjacent two first regions of the first regions.

Also disclosed is a circuit including a silicon controlled rectifier (SCR) and a MOS circuit. The silicon controlled rectifier includes a first diode and a second diode, in which each of the first and second diodes has a P type region and an N type region. The MOS circuit includes MOS transistors cascade-connected between the N type regions of the first and second diodes or between the P type regions of the first and second diodes.

Also disclosed is a method includes the steps outlined below. A voltage surge is received to conduct a current path. The SCR is triggered to discharge the voltage surge. The current path has a MOS circuit and one of a first diode and a second diode in a silicon controlled rectifier. Each of the first and second diodes has a P type region and an N type region, and the MOS circuit comprises MOS transistors cascade-connected between the N type regions or the P type regions of the first and second diodes.

As is understood by one of ordinary skill is the art, the foregoing embodiments of the present disclosure are illustrative of the present disclosure rather than limiting of the present disclosure. It is intended to cover various modifications and similar arrangements included within the spirit and scope of the appended claims, the scope of which should be accorded with the broadest interpretation so as to encompass all such modifications and similar structures.

What is claimed is:

1. A semiconductor device, comprising:
a first well of a first conductivity type and a second well of a second conductivity type;
a plurality of first regions of the first conductivity type formed in the second well;
a second region of the second conductivity type formed in the first well; and
a plurality of electrodes comprising a first electrode and a second electrode, each of the first electrode and the second electrode formed upon the second well and between adjacent two first regions of the first regions,
wherein the first electrode is configured to be biased by a voltage at one of the two first regions which are adjacent to the first electrode, and
the second electrode is configured to be biased by a voltage at one of the two first regions which are adjacent to the second electrode.

2. The semiconductor device of claim 1, wherein the first regions and the second region are formed with a planar-type structure.

3. The semiconductor device of claim 1, wherein the first regions and the second region are formed with a fin-type structure.

4. The semiconductor device of claim 1, wherein the second region, the first well, the second well and one of the first regions together form a structure operating as silicon controlled rectifier (SCR).

5. The semiconductor device of claim 4, wherein the first regions together with the corresponding electrodes form cascaded MOS transistors.

6. The semiconductor device of claim 1, wherein the first conductivity type is P type while the second conductivity type is N type, and the first conductivity type is N type while the second conductivity type is P type.

7. The semiconductor device of claim 1, wherein the first electrode and the second electrode are formed as gates of two MOS transistors, respectively, and the first regions which are electrically connected to the first electrode and the second electrode, respectively, are formed as drains of the two MOS transistors, respectively.

8. A circuit comprising:
a silicon controlled rectifier (SCR) comprising a first diode and a second diode, each of the first and second diodes having a P type region and an N type region; and
a MOS circuit comprising a first MOS transistor and a second MOS transistor that are cascade-connected between the P type regions of the first and second diodes or between the N type regions of the first and second diodes;
wherein a control terminal of the first MOS transistor is configured to be biased by a voltage at a first terminal of the first MOS transistor, and a control terminal of the second MOS transistor is configured to be biased by a voltage at a first terminal of the second MOS transistor.

9. The circuit of claim 8, wherein a gate and a drain of the first MOS transistor are electrically connected together, and a gate and a drain of the second MOS transistor are electrically connected together.

10. The circuit of claim 8, wherein each of the first MOS transistor and the second MOS transistor is a PMOS transistor, and the first MOS transistor and the second MOS transistor are cascade-connected between the P type region of the first diode and the P type region of the second diode.

11. The circuit of claim 8, wherein the P type region of the first diode is electrically connected to a pad, and the N type region of the second diode is electrically connected to a reference voltage.

12. The circuit of claim 8, wherein each one of the first MOS transistor and the second MOS transistor is an NMOS transistor, and the first MOS transistor and the second MOS transistor are cascade-connected between the N type regions of the first and second diodes.

13. A method, comprising:
receiving a voltage surge to conduct a current path; and
triggering a silicon controlled rectifier (SCR) to discharge the voltage surge;
wherein the current path has a MOS circuit and one of a first diode and a second diode in the SCR,
each of the first and second diodes has a P type region and an N type region, and the MOS circuit comprises a first MOS transistor and a second MOS transistor that are cascade-connected between the P type regions of the first and second diodes or between the N type regions of the first and second diodes;
wherein a control terminal of the first MOS transistor is configured to be biased by a voltage at a first terminal of the first MOS transistor; and a control terminal of the second MOS transistor is configured to be biased by a voltage at a first terminal of the second MOS transistor.

14. The method of claim 13, wherein each of the MOS transistors is a PMOS transistor, and receiving the voltage surge comprises:
receiving the voltage surge at one of the cascade-connected PMOS transistors to conduct the cascade-connected PMOS transistors; and
directing the voltage surge to the P type region of the second diode to conduct the second diode.

15. The method of claim 14, wherein the operation of triggering the SCR comprises:
conducting a first bipolar junction transistor (BJT) having the second diode in the SCR; and
conducting the first diode to conduct a second BJT having the first diode in the SCR.

16. The method of claim 13, wherein each of the MOS transistors is an NMOS transistor, and receiving the voltage surge comprises:
receiving the voltage surge at the P type region of the first diode to conduct the first diode; and
conducting the cascade-connected NMOS transistors.

17. The method of claim 16, wherein triggering the SCR comprises:
conducting a first bipolar junction transistor (BJT) having the first diode in the SCR; and
conducting the second diode to conduct a second BJT having the second diode in the SCR.

18. The method of claim 13, wherein a gate and a drain of the first MOS transistor are electrically connected together, and a gate and a drain of the second MOS transistor are electrically connected together.

* * * * *

UNITED STATES PATENT AND TRADEMARK OFFICE
CERTIFICATE OF CORRECTION

PATENT NO.        : 9,236,733 B2
APPLICATION NO.   : 13/952417
DATED             : January 12, 2016
INVENTOR(S)       : Yu-Ti Su et al.

It is certified that error appears in the above-identified patent and that said Letters Patent is hereby corrected as shown below:

Title Page, (72) Inventor(s): should be --Yu-Ti Su, Tainan City (TW); Wun-Jie Lin, Hsinchu City (TW); Tsung-Che Tsai, Hsinchu City (TW); Jen-Chou Tseng, Hsinchu County (TW)--

Signed and Sealed this
Twenty-fourth Day of May, 2016

Michelle K. Lee
*Director of the United States Patent and Trademark Office*

UNITED STATES PATENT AND TRADEMARK OFFICE
CERTIFICATE OF CORRECTION

PATENT NO. : 9,236,733 B2
APPLICATION NO. : 13/952417
DATED : January 12, 2016
INVENTOR(S) : Yu-ti Su It is certified that error appears in the above-identified patent and that said Letters Patent is hereby corrected as shown below:

Title page Item (71) Applicant should read: TAIWAN SEMICONDUCTOR MANUFACTURING COMPANY, LTD. Hsinchu (TW)

Signed and Sealed this
Fifth Day of July, 2016

Michelle K. Lee
*Director of the United States Patent and Trademark Office*